United States Patent
Lee

(10) Patent No.: US 9,530,467 B1
(45) Date of Patent: Dec. 27, 2016

(54) SEMICONDUCTOR MEMORY DEVICE AND OPERATING METHOD THEREOF

(71) Applicant: SK hynix Inc., Icheon-si Gyeonggi-do (KR)

(72) Inventor: Jin Yong Lee, Icheon-si (KR)

(73) Assignee: SK HYNIX INC., Icheon-Si (KR)

( * ) Notice: Subject to any disclaimer, the term of this patent is extended or adjusted under 35 U.S.C. 154(b) by 0 days.

(21) Appl. No.: 15/150,602

(22) Filed: May 10, 2016

(30) Foreign Application Priority Data

Dec. 8, 2015 (KR) .................. 10-2015-0174223

(51) Int. Cl.
| | | |
|---|---|---|
| G11C 16/06 | (2006.01) | |
| G11C 7/10 | (2006.01) | |
| G11C 7/06 | (2006.01) | |
| G11C 7/12 | (2006.01) | |
| G11C 8/10 | (2006.01) | |

(52) U.S. Cl.
CPC ............ *G11C 7/1039* (2013.01); *G11C 7/062* (2013.01); *G11C 7/12* (2013.01); *G11C 8/10* (2013.01)

(58) Field of Classification Search
CPC ......... G11C 16/00; G11C 7/10; H01L 23/3114
USPC ................ 365/185.17, 185.33, 174, 205
See application file for complete search history.

(56) References Cited

U.S. PATENT DOCUMENTS

2012/0168858 A1* 7/2012 Hong ............... H01L 27/11573
257/330
2014/0242765 A1* 8/2014 Lee .................. H01L 27/11582
438/268

FOREIGN PATENT DOCUMENTS

| KR | 1020120098078 A | 9/2012 |
| KR | 1020120119324 A | 10/2012 |
| KR | 1020130070922 A | 6/2013 |

* cited by examiner

*Primary Examiner* — Han Yang
(74) *Attorney, Agent, or Firm* — William Park & Associates Ltd.

(57) ABSTRACT

Disclosed are a semiconductor memory device and an operating method thereof. The semiconductor memory device may include a memory cell array, a page buffer group, and a control logic. The memory cell array may include a first memory string and a second memory string, which have different channel lengths. The page buffer group may perform a sensing operation on the memory cell array in response to a page buffer sensing signal. The control logic may control the page buffer group to perform the sensing operation, and, during the sensing operation and output the adjusted page buffer sensing signal, may adjust a voltage level of the page buffer sensing signal according to a selected memory string.

20 Claims, 6 Drawing Sheets

US 9,530,467 B1

SEMICONDUCTOR MEMORY DEVICE AND OPERATING METHOD THEREOF

CROSS-REFERENCE TO RELATED APPLICATION

The present application claims priority under 35 U.S.C. §119(a) to Korean patent application number 10-2015-0174223 filed on Dec. 8, 2015, in the Korean Intellectual Property Office, the entire disclosure of which is incorporated herein by reference.

BACKGROUND

1. Technical Field

Embodiments of the present disclosure generally relate to an electronic device, and more particularly to a semiconductor memory device and an operating method thereof.

2. Related Art

Semiconductor memory devices may be classified into volatile memory devices and nonvolatile memory devices.

Although the nonvolatile memory device has a relatively low write and read speed, it maintains stored data even without any external power source. The nonvolatile memory device is typically used for long-term persistent storage. Examples of the nonvolatile memory device may include a Read Only Memory (ROM), a Mask ROM (MROM), a Programmable ROM (PROM), an Electrically Programmable ROM (EPROM), an Electrically Erasable and Programmable ROM (EEPROM), a flash memory, a Phase-change RAM (PRAM), a Magnetic RAM (MRAM), a Resistive RAM (RRAM), a Ferroelectric RAM (FRAM), and the like. The flash memory may be divided into a NOR type and a NAND type.

Like random-access memory (RAM), the flash memory may be freely programmed and erased, whereas, like the ROM, the stored data can be maintained even in the absence of a power supply. The flash memory is widely used as a storage medium of a portable electronic device, such as a digital camera, a Personal Digital Assistant (PDA), and an MP3 player.

SUMMARY

In an embodiment of the present disclosure, a semiconductor memory device may include a memory cell array, a page buffer group, and a control logic. The memory cell array may include a first memory string and a second memory string, which have different channel lengths. The page buffer group may perform a sensing operation on the memory cell array in response to a page buffer sensing signal. The control logic may control the page buffer group to perform the sensing operation, and, during the sensing operation and output the adjusted page buffer sensing signal, adjust a voltage level of the page buffer sensing signal according to a selected memory string.

In an embodiment of the present disclosure, a semiconductor memory device may include a memory cell array, a page buffer group, and a control logic. The memory cell array may include first memory strings having a first channel length and second memory strings having a second channel length shorter than the first channel length. The page buffer group may perform a sensing operation on the memory cell array in response to a first page buffer sensing signal, which has a first voltage level when enabled, or a second page buffer sensing signal, which has a second voltage level when enabled, the second voltage level being lower than the first voltage level. The control logic may generate the first page buffer sensing signal or the second page buffer sensing signal in response to an address signal.

In an embodiment of the present disclosure, a method of operating a semiconductor memory device may include providing a memory cell array including a first memory string and a second memory string, which have different channel lengths, setting a voltage level of a page buffer sensing signal in response to an address signal, and selecting one of the first memory string and the second memory string in response to the address, and performing a sensing operation according to the page buffer sensing signal set with the voltage level.

DETAILED DESCRIPTION OF THE INVENTION

Figure 1:
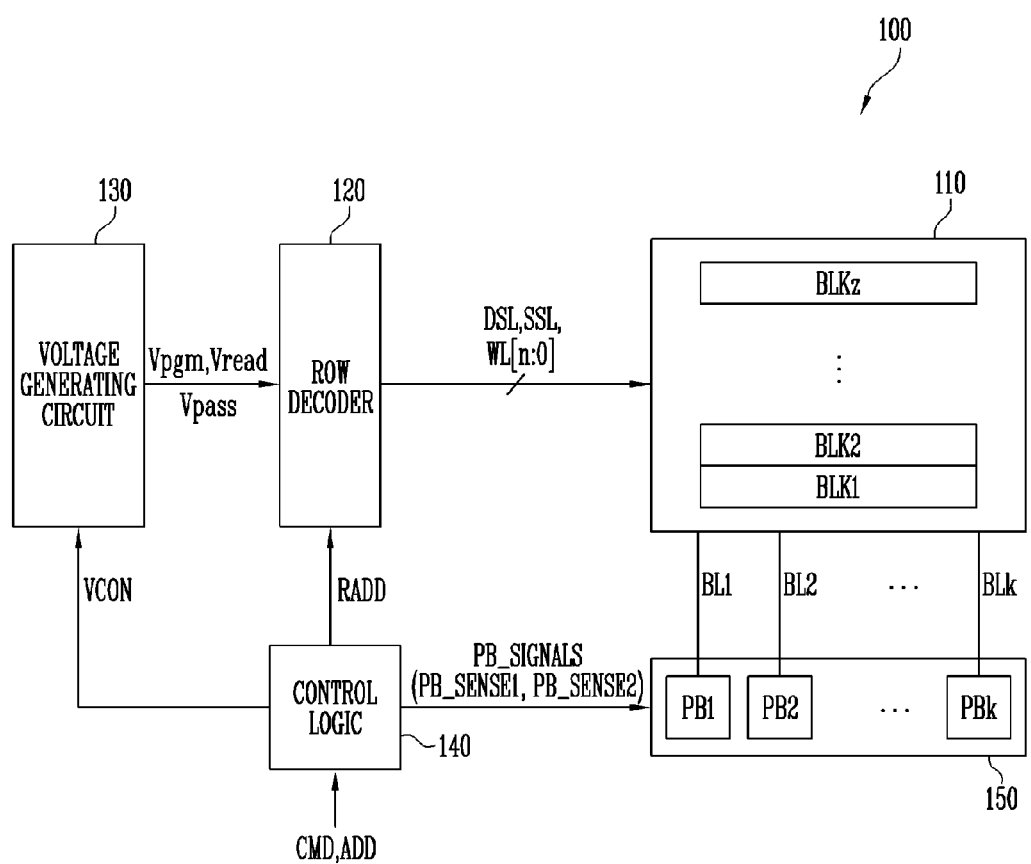
FIG. 1 is a diagram illustrating an example of a semiconductor memory device according to an embodiment of the present disclosure.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

Advantages and features of the present disclosure and methods of achieving the advantages and features will be clear with reference to embodiments described in detail below together with the accompanying drawings. However, the present disclosure is not limited to the embodiments described herein, and may be implemented in various different forms. However, the embodiments described herein are provided so as to describe the present disclosure in detail so that those skilled in the art may easily carry out the technical spirit of the present disclosure.

Throughout this specification and the claims that follow, when it is described that an element is "coupled" to another element, the element may be "directly coupled" to the other element or "electrically coupled" to the other element through a third element. Throughout the specification and the claims, unless explicitly described to the contrary, the word "comprise" and variations such as "comprises" or "comprising" will be understood to imply the inclusion of stated elements but not the exclusion of any other elements.

FIG. 1 is a diagram illustrating an example of a semiconductor memory device according to an embodiment of the present disclosure.

Referring to FIG. 1, a semiconductor memory device 100 may include a memory cell block 110, a row decoder 120, a voltage generating circuit 130, a control logic 140, and a page buffer group 150.

The memory cell array 110 includes a plurality of memory blocks BLK1 to BLKz. The plurality of memory blocks BLK1 to BLKz may be coupled to the row decoder 120 through selection lines DSL and SSL and word lines WL[n:0]. The plurality of memory blocks BLK1 to BLKz may be coupled to the page buffer group 150 through bit lines BL1 to BLk. Each of the memory blocks BLK1 to BLKz may include a plurality of memory cells. In an embodiment, the plurality of memory cells may be nonvolatile memory cells. For example, the memory cells may be charge-trapping cells. Alternatively, the memory cells may have floating gates. Memory cells connected to, among the plurality of memory cells, the same word line may be defined as one page. That is, the memory cell array 110 may consist of a plurality of pages. Each of the plurality of memory blocks BLK1 to BLKz of the memory cell array 110 may include a plurality of memory cell strings. Each of the memory cell strings may include a drain select transistor cell, a plurality of memory cells, and a source select transistor cell, which are connected in series between the bit line and the source line.

A detailed structure of the plurality of memory blocks BLK1 to BLKz will be described below.

The row decoder 120 may output operation voltages Vpgm, Vread, and Vpass output from the voltage generating circuit 130 to the word lines WL[n:0] of the memory cell array 110 in response to row address signals RADD output from the control logic 140.

The voltage generating circuit 130 may generate the operation voltages Vpgm, Vread, and Vpass used in a general operation of the memory cells and output the generated operation voltages in response to a voltage control signal VOCN output from the control logic 140.

The control logic 140 may control the row decoder 120, the voltage generating circuit 130, and the page buffer group 150 in order to perform a program operation, a verification operation, a read operation, or an erase operation in response to a command signal CMD input through an input/output circuit (not illustrated) from an external device. For example, the control logic 140 may generate the voltage control signal VCON and output the generated voltage control signal VCON so that the voltage generating circuit 130 generates the operation voltages Vpgm, Vread, and Vpass in response to the command signal CMD. Further, the control logic 140 may output the row address signal RADD for controlling the row decoder 120 in response to an address signal ADD input from the external device through the input/output circuit (not illustrated). Further, the control logic 140 may output page buffer control signals PB_SIGNALS (PB_SENSE1 or PB_SENSE2) for controlling the page buffer group 150 in response to the address signal ADD and the command signal CMD. The control logic 140 may select one of a first page buffer sensing signal PB_SENSE1 and a second page buffer sensing signal PB_SENSE2 according to the address signal ADD, and may output the selected signal to the page buffer group 150. The first page buffer sensing signal PB_SENSE1 and the second page buffer sensing signal PB_SENSE2 may be activated at different voltage levels. For example, an active state of the first page buffer sensing signal PB_SENSE1 may have higher voltage level than an active state of the second page buffer sensing signal PB_SENSE2.

The page buffer group 150 may be coupled to the memory cell array 110 through the bit lines BL1 to BLk. The page buffer group 150 may include a plurality of page buffers PB1 to PBk. The plurality of page buffers PB1 to PBk may operate in response to the page buffer control signals PB_SIGNALS of the control logic 140. For example, the plurality of page buffers PB1 to PBk may temporarily store program data input from the external device during a program operation, and then adjust potential levels of the corresponding bit lines BL1 to BLk according to the temporarily stored data. The plurality of page buffers PB1 to PBk may sense potential levels or an account of current of the corresponding bit lines BL1 to BLk and generate read data during a read operation to output the generated read data to the external device.

Figure 2:
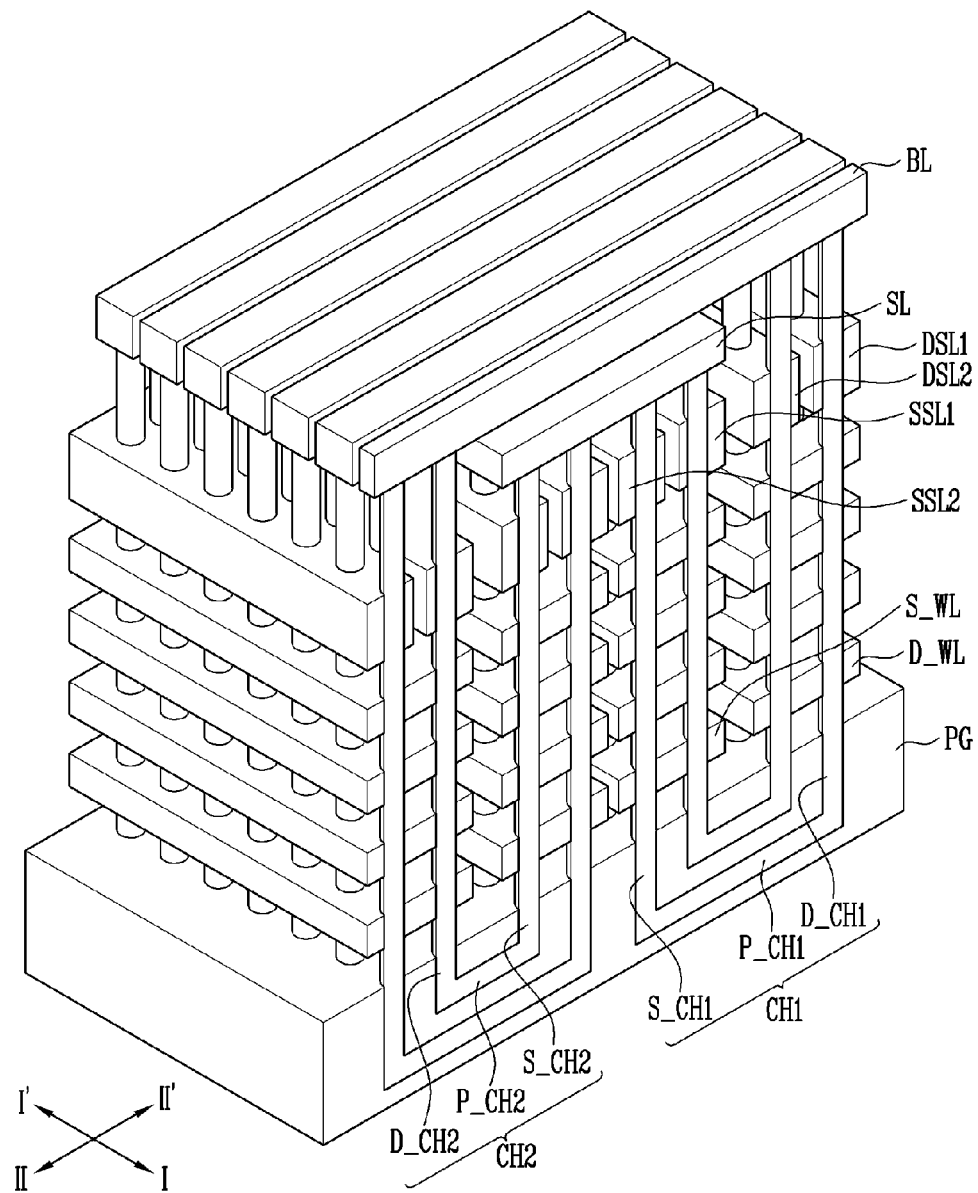
FIG. 2 is a diagram illustrating an example of a memory block having a 3D structure illustrated in FIG. 1.

FIG. 2 is a diagram illustrating an example of the memory block having a 3D structure illustrated in FIG. 1.

Referring to FIG. 2, the memory block having a 3D structure may include a pipe gate PG, first channels CH1, and second channels CH2.

Here, the first channel CH1 may include a first pipe channel P-CH1 at least a lower portion of which is buried in the pipe gate PG, and may also include a pair of first source side channel S_CH1 and first drain side channel D_CH1 connected to the first pipe channel P-CH1. Further, the second channel CH2 may include a second pipe channel P-CH2 at least a lower portion of which is buried in the pipe gate PG, and may also include a pair of second source side channel S_CH2 and second drain side channel D_CH2 connected to the second pipe channel P-CH2.

The second channel CH2 is formed over the first channel CH1. In an embodiment, the first channel CH1 and the second channel CH2 may make one pair. Although it is illustrated that the first channel CH1 and the second channel CH2 are positioned on the same cross-section, but the first channel CH1 and the second channel CH2 may also be positioned on different cross-sections.

Source side word lines S_WL and drain side word lines D_WL extending in a first direction I-I' in parallel may be stacked on the pipe gate PG. Here, the source side word lines S_WL may surround first source side channels S_CH1 of the first channels CH1 and second source side channels S_CH2 of the second channels CH2. Further, the drain side word lines D_WL may surround first drain side channels D_CH1 of the first channels CH1 and second drain side channels D_CH2 of the second channels CH2.

At least one layer of first source selection lines SSL1 or second source selection lines SSL2 extending in the first direction I-I' in parallel may be provided on the source side word lines S_WL. At least one layer of first drain selection lines DSL1 or second drain selection lines DSL2 extending in the first direction I-I' in parallel may be provided on the drain side word lines D_WL. Here, the first source selection lines SSL1 may surround the first source side channels S_CH1 of the first channels CH1, and the second source selection lines SSL2 may surround the second source side channels S_CH2 of the second channels CH2. Further, the first drain selection lines DSL1 may surround the first drain side channels D_CH1 of the first channels CH1, and the second drain selection lines DSL2 may surround the second drain side channels D_CH2 of the second channels CH2.

The source lines SL extending in the first direction I-I' in parallel may be provided on the first and second source select lines SSL1 and SSL2. Further, the bit lines BL extending in a second direction II-II' in parallel may be provided on the source lines SL. Here, the first channel CH1 and the second channel CH2 making one pair may be coupled to the same bit line BL. Each of the first channel CH1 and the second channel CH2 may be defined as one memory string.

In an embodiment, the channels CH1 and CH2 are provided in a stack form, thereby further improving an integration density of the memory device. However, because the second channel CH2 is disposed over the first channel CH1, a vertical length of the first channel CH1 is larger than a vertical length of the second channel CH2. Accordingly, during a sensing operation of the semiconductor memory device, a cell current value may be different from each other according to the channel length of the first channel CH1 and the second channel CH2.

It may be defined that, in the memory block having the 3D structure, the first channel CH1 and the second channel CH2 belong to different memory blocks from one other. For example, the memory string corresponding to the first channel CH1 may belong to the first memory block, and the memory string corresponding to the second channel CH1 may belong to the second memory block. Accordingly, block addresses assigned to the memory string corresponding to the first channel CH1 may be different from block addresses of the memory string corresponding to the second channel CH2.

Further, when it is defined that both the first channel CH1 and the second channel CH2 are assigned to the same memory block, one of the memory string corresponding to the first channel CH1 and the memory string corresponding to the second channel CH2 may be assigned to an even column, and the other one may be assigned to an odd column by being connected to different bit lines that are assigned to the same memory block. Accordingly, different column addresses may be assigned to the memory string corresponding to the first channel CH1 and the memory string corresponding to the second channel CH2.

Figure 3:
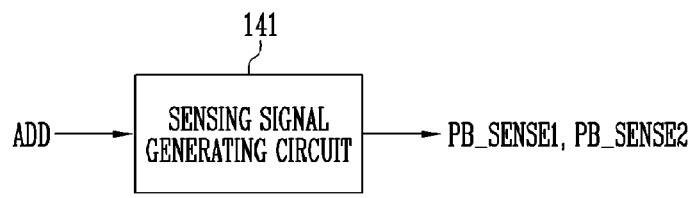
FIG. 3 is a diagram illustrating an example of a sensing signal generating circuit included in a control logic of FIG. 1.

FIG. 3 is a diagram illustrating an example of a sensing signal generating circuit included in the control logic of FIG. 1.

Referring to FIG. 3, the control logic 140 of FIG. 1 may include a sensing signal generating circuit 141. The sensing signal generating circuit 141 may generate the first page buffer sensing signal PB_SENSE1 and/or the second page buffer sensing signal PB_SENSE2 during the sensing operation. The sensing operation may be performed to detect a threshold voltage distribution of the memory cell during a program verification operation, an erase verification operation, and a read operation of the semiconductor memory device. The first page buffer sensing signal PB_SENSE1 and the second page buffer sensing signal PB_SENSE2 may be applied to the plurality of page buffers included in the page buffer group 150 during the sensing operation and control the sensing operations of the plurality of page buffers.

The sensing signal generating circuit 141 may generate the first page buffer sensing signal PB_SENSE1 and/or the second page buffer sensing signal PB_SENSE2 in response to the address signal ADD input from the external device.

For example, when the first channel CH1 and the second channel CH2 of FIG. 2 are assigned to different memory blocks from one another, the sensing signal generating circuit 141 may generate one of the first page buffer sensing signal PB_SENSE1 and the second page buffer sensing signal PB_SENSE2 in response to a block address in the address signal ADD. That is, the sensing signal generating circuit 141 may output the first page buffer sensing signal PB_SENSE1 having a higher voltage level than that of the second page buffer sensing signal PB_SENSE2 during the sensing operation of the memory string corresponding to the first channel CH1, and may output the second page buffer sensing signal PB_SENSE2 having a lower voltage level than that of the first page buffer sensing signal PB_SENSE1 during the sensing operation of the memory string corresponding to the second channel CH2.

Further, when the first channel CH1 and the second channel CH2 of FIG. 2 are assigned to the same memory block and assigned to the even column and the odd column, respectively, the sensing signal generating circuit 141 may generate both the first page buffer sensing signal PB_SENSE1 and the second page buffer sensing signal PB_SENSE2, and, in response to the column address in the address signal ADD, the sensing signal generating circuit 141 may transmit different page buffer sensing signals to the page buffers corresponding to the even column and the page buffers corresponding to the odd column to distinguish between the even column and the odd column. For example, the sensing signal generating circuit 141 may output the first page buffer sensing signal PB_SENSE1 having a higher voltage level than that of the second page buffer sensing signal PB_SENSE2 to the page buffers corresponding to the even column when the memory string corresponding to the first channel CH1 is defined as the even column, and outputs the second page buffer sensing signal PB_SENSE2 having a lower voltage level than that of the first page buffer sensing signal PB_SENSE1 to the page buffers corresponding to the odd column when the memory string corresponding to the second channel CH2 is defined as the odd column.

As described above, in response to the address signal ADD, the sensing signal generating circuit 141 may generate the first page buffer sensing signal PB_SENSE1 and the second page buffer sensing signal PB_SENSE2 in such a manner that the first page buffer sensing signal PB_SENSE1 has a higher voltage level than that of the second page buffer sensing signal PB_SENSE2 during the sensing operation of the memory string corresponding to the first channel CH1 having a relatively larger channel length, and the second page buffer sensing signal PB_SENSE2 has a lower voltage level than that of the first page buffer sensing signal PB_SENSE1 during the sensing operation of the memory string corresponding to the second channel CH2 having a relatively smaller channel length.

Figure 4:
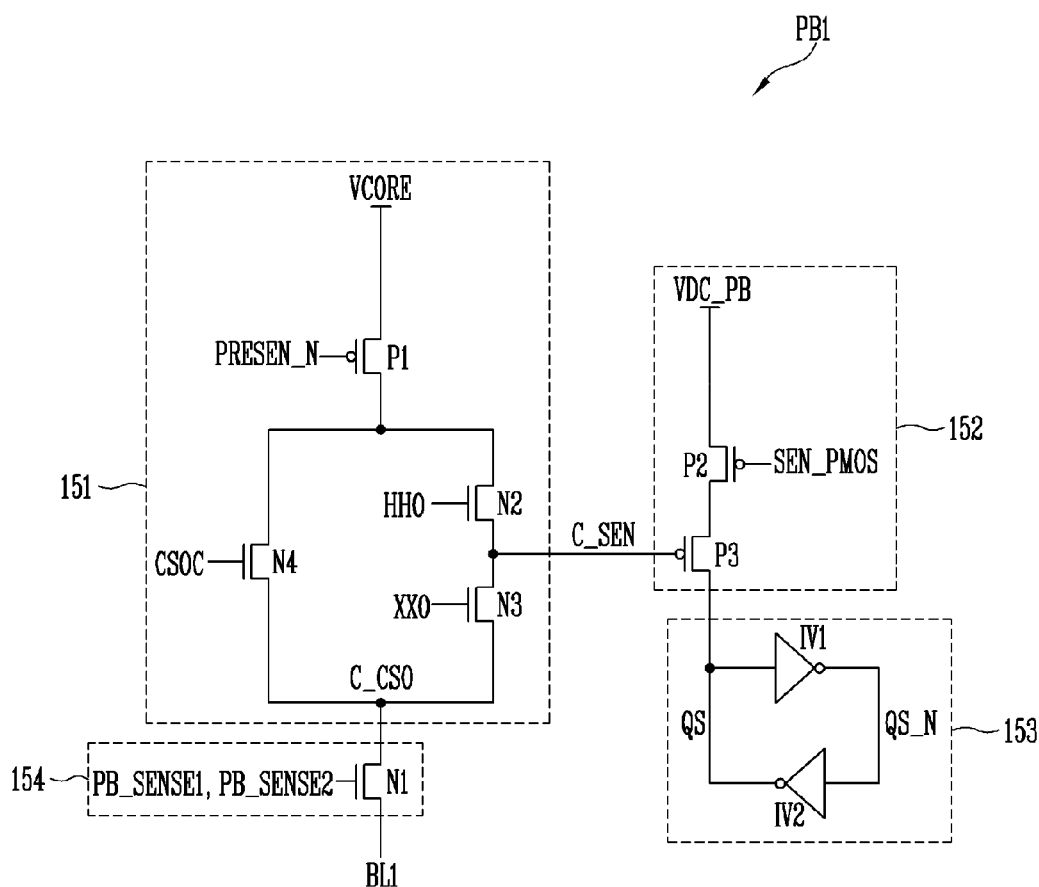
FIG. 4 is a diagram illustrating an example of a page buffer.

FIG. 4 is a diagram illustrating an example of the page buffer according to an embodiment of the present disclosure.

Referring to FIG. 4, the page buffer PB1 may include a clamp circuit 151, a current determining circuit 152, a latch circuit 153, a bit line connecting circuit 154.

The clamp circuit 151 may include a PMOS transistor P1 and NMOS transistors N2, N3, and N4. The PMOS transistor P1 and the NMOS transistor N4 may be connected in series between a core voltage VCORE terminal and a control node C_CSO. The PMOS transistor P1 may be turned on in response to a presensing signal PRESEN_N, and the NMOS transistor N4 may be turned on in response to a control node connection signal CSOC so that the core voltage VCORE is applied to the control node C_CSO. The NMOS transistors N2 and N3 may be connected in series between the PMOS transistor P1 and the control node C_CSO, and a node between the NMOS transistor N2 and the NMOS transistor N3 may be defined as a sensing node C_SEN. The NMOS transistor N2 may be turned on in response to a first control signal HHO so that the sensing node C_SEN is precharged by the core voltage VCORE. The NMOS transistor N3 may be turned on in response to a second control signal XXO to electrically connect the control node C_CSO to the sensing node C_SEN.

The current determining circuit 152 may include PMOS transistors P2 and P3. The PMOS transistors P2 and P3 may be connected in series between a voltage terminal providing a down converting voltage VDC_PB and a first node QS of the latch circuit 153. The PMOS transistor P2 may be turned on in response to a sensing signal SEN_PMOS, and the PMOS transistor P3 may be turned on in response to a potential of the sensing node C_SEN to adjust an amount of current flowing because of the down converting voltage VDC_PB applied to the first node QS.

The latch circuit 153 may include inverters IV1 and IV2, connected back-to-back, i.e. an output of one is connected to an input of the other and vice-versa. The latch circuit 153 may be coupled between a second node QS_N and the first node QS which is coupled to the current determination circuit 152. The latch circuit 153 stores data corresponding to the amount of current applied to the first node QS as sensing data.

The bit line connecting circuit 154 may be coupled between the bit line BL1, which is coupled to the plurality of memory cells, and the control node C_CSO to electrically connect the bit line BL1 and the control node C_CSO in response to the first page buffer sensing signal PB_SENSE1 or the second page buffer sensing signal PB_SENSE2. The bit line connecting circuit 154 may include the NMOS transistor N1. Further, the bit line connecting circuit 154 may adjust an amount of current flowing because of a precharge voltage applied to the bit line during a bit line precharge operation, or may adjust an amount of cell current flowing from the bit line BL1 to the control node C_CSO during a bit line current sensing operation in response to the first page buffer sensing signal PB_SENSE1 or the second page buffer sensing signal PB_SENSE2.

Figure 5:
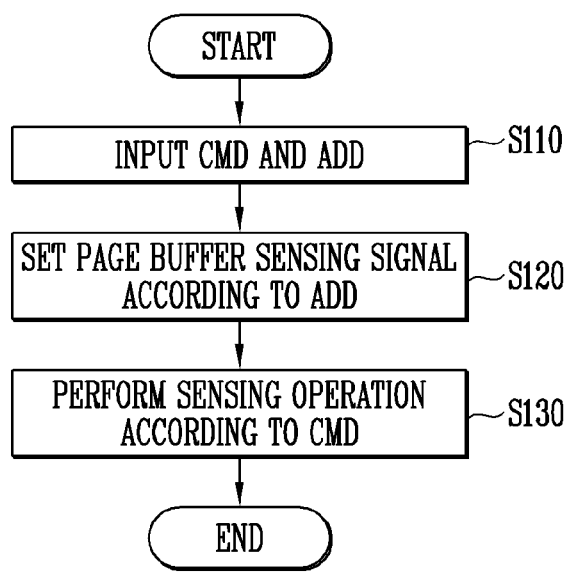
FIG. 5 is a flowchart illustrating an example operation of the semiconductor memory device according to an embodiment of the present disclosure.

FIG. 5 is a flowchart illustrating an example of an operation of the semiconductor memory device according to an embodiment of the present disclosure.

An operating method of the semiconductor memory device according to an embodiment of the present disclosure will be described with reference to FIGS. 1 to 5.

Some embodiments of the present disclosure will be described based on a read operation as an example, and the description is also applicable to a program verification operation and an erase verification operation including the sensing operation.

First, an operation command and an address are input (S110).

In response to a command signal CMD for a read operation of the semiconductor memory device, the control logic 140 may control the voltage generating circuit 130 to generate a plurality of operation voltages Vread and Vpass for performing the read operation.

Thereafter, a page buffer sensing signal may be set according to the address (S120).

In response to the address signal ADD, the control logic 140 may determine whether the memory strings, which have been selected to perform the read operation, have a first channel CH1 structure or a second channel CH2 structure, and may accordingly set whether to generate a first page buffer sensing signal PB_SENSE1 or a second page buffer sensing signal PB_SENSE2. For example, in response to the address signal ADD, the sensing signal generating circuit 141 of the control logic 140 may determine whether the selected memory strings have the first channel CH1 structure or the second channel CH2 structure. That is, in response to a block address or a column address in the address signal ADD, the sensing signal generating circuit 141 may determine whether the memory string, which has been selected to perform the read operation, has the first channel CH1 structure or the second channel CH2 structure, and may accordingly output the first page buffer sensing signal PB_SENSE1 or the second page buffer sensing signal PB_SENSE2 during the sensing operation according to the result of the determination. For example, when the selected memory strings have the first channel CH1 structure having a relatively larger channel length, the sensing signal generating circuit 141 may be set to output the first page buffer sensing signal PB_SENSE1 having a relatively higher voltage level, and when the selected memory strings have the second channel CH2 structure having a relatively smaller channel length, the sensing signal generating circuit 141 may be set to output the second page buffer sensing signal PB_SENSE2 having a relatively lower voltage level.

After the setting of the sensing signal generating circuit 141, the sensing operation may be performed according to the operation command (S130).

The plurality of page buffers PB1 to PBk of the page buffer group 150 may perform the sensing operation according to page buffer control signals PB_SIGNALS output from the control logic 140.

The sensing operation may include a bit line precharge operation and a current sensing operation.

In the bit line precharge operation, the bit line connecting circuit 154 of the page buffer PB1 may be turned on in response to the first page buffer sensing signal PB_SENSE1 or the second page buffer sensing signal PB_SENSE2, and may connect the bit line BL1 to the control node C_CSO. The clamp circuit 151 of the page buffer PB1 may provide the core voltage VCORE to the bit line BL1 through the control node C_CSO in response to a presensing signal PRESEN_N of a low level and a control node connection signal CSOC of a high level to precharge the bit line BL1 to a predetermined level. The bit line connecting circuit 154 may adjust a precharge level by adjusting an amount of current applied to the bit line BL1 according to the first page buffer sensing signal PB_SENSE1 or the second page buffer sensing signal PB_SENSE2. For example, when the selected memory string has the first channel CH1 structure, the bit line connecting circuit 154 may precharge the bit line BL1 in response to the first page buffer sensing signal PB_SENSE1, and when the selected memory string has the second channel CH2 structure, the bit line connecting circuit 154 may precharge the bit line BL1 in response to the second page buffer sensing signal PB_SENSE2 so that the bit line BL1 may be precharged to different levels.

In the current sensing operation, the voltage generating circuit 130 may generate a read voltage Vread and a pass voltage Vpass for the read operation, and the row decoder 120 may apply the read voltage Vread and the pass voltage Vpass to a selected word line and non-selected word lines of the selected memory block, respectively, in response to a row address RADD.

When the read voltage is applied to the selected word line coupled to the selected memory cell, a current flowing through the precharged bit line BL1 may change according to a program state of the selected memory cell. For example, when the read voltage Vread is higher than a threshold voltage of the selected memory cell, a channel may be formed in the memory cell to allow the current to flow through the bit line BL1. When the threshold voltage of the selected memory cell is higher than the read voltage Vread, because a channel is not formed in the memory cell, the current does not flow through the bit line BL1. As described above, the current flowing through the bit line BL1 may be lower or higher than a reference current according to the state of the selected memory cell.

The bit line connecting circuit 154 of the page buffer PB1 may be turned on in response to the first page buffer sensing signal PB_SENSE1 or the second page buffer sensing signal PB_SENSE2 to connect the bit line BL1 to the control node C_CSO. When the NMOS transistor N3 is turned on in response to a second control signal XXO, the current flowing through the bit line BL1 may be reflected in the control node C_CSO and the sensing node C_SEN. As a result, a potential level of the sensing node C_SEN may be maintained at the precharge level, or may be discharged to the low level, and thus the PMOS transistor P3 may be turned on or turned off. The bit line connecting circuit 154 may adjust an amount of current flowing through the control node C_CSO from the bit line BL1 according to the first page buffer sensing signal PB_SENSE1 or the second page buffer sensing signal PB_SENSE2. Accordingly, even if a channel length variation of the selected memory strings makes a difference in the cell current, the bit line connecting circuit 154 may adjust the amount of cell current flowing into the page buffer PB1 so that a uniform current flows through the page buffer PB1 according to the first page buffer sensing signal PB_SENSE1 or the second page buffer sensing signal PB_SENSE2 applied to the bit line connecting circuit 154.

The first node Qs may be maintained in an initial state (e.g., the low level), or may be changed to the high level according to the turn-on or turn-off operation of the PMOS transistor P3, so that the latch circuit 153 latches the sensing data.

As described above, in various embodiments of the present disclosure, even during the sensing operation of the memory strings having different channel lengths, the sensing operation may be accurately performed by adjusting an amount of cell current to a uniform amount by using different page buffer sensing signals.

Figure 6:
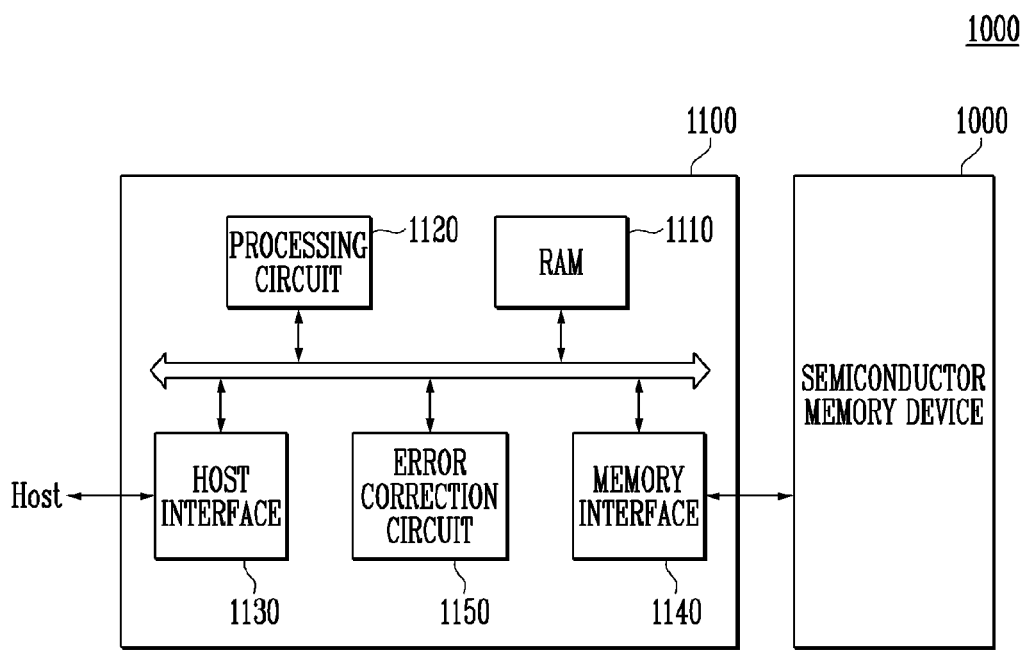
FIG. 6 is a diagram illustrating an example of a memory system including the semiconductor memory device of FIG. 1.

FIG. 6 is a diagram illustrating an example of a memory system including the semiconductor memory device of FIG. 1.

Referring to FIG. 6, a memory system 1000 may include the semiconductor memory device 100 and a controller 1100.

The semiconductor memory device 100 may be configured and operate in a similar manner to that described with reference to FIG. 1. Hereinafter, any repetitive detailed description will be omitted or simplified.

The controller 1100 may be coupled to a host Host and the semiconductor memory device 100. The controller 1100 may access the semiconductor memory device 100 in response to a request from the host Host. For example, the controller 1100 may control the read, write, erase, and background operations of the semiconductor memory device 100. The controller 1100 may provide an interface between the semiconductor memory device 100 and the host Host. The controller 1100 may drive firmware for controlling the semiconductor memory device 100.

The controller 1100 may include a Random Access Memory (RAM) 1110, a processing circuit 1120, a host interface 1130, a memory interface 1140, and an error correction circuit 1150. The RAM 1110 may be used as at least one of a working memory of the processing circuit 1120, a cache memory between the semiconductor memory device 100 and the host Host, and a buffer memory between the semiconductor memory device 100 and the host Host. The processing circuit 1120 may control a general operation of the controller 1100. Further, the controller 1100 may temporarily store program data provided from the host Host during the write operation.

The host interface 1130 may include a protocol for performing a data exchange between the host Host and the controller 1100. In an embodiment, the controller 1200 may communicate with the host Host through at least one of various interface protocols, such as a Universal Serial Bus (USB) protocol, a Multimedia Card (MMC) protocol, a Peripheral Component Interconnection (PCI) protocol, a PCI-express (PCI-E) protocol, an Advanced Technology Attachment (ATA) protocol, a Serial-ATA protocol, a Parallel-ATA protocol, a small computer small interface (SCSI) protocol, an enhanced small disk interface (ESDI) protocol, and an Integrated Drive Electronics (IDE) protocol, and a private protocol.

The memory interface 1140 may interface with the semiconductor memory device 100. For example, the memory interface may include a NAND interface or a NOR interface.

The error correction circuit 1150 may detect/correct an error of the data received from the semiconductor memory device 100 by using an Error Correction Code (ECC). In an embodiment, the error correction circuit may be provided as a component of the controller 1100.

The controller 1100 and the semiconductor memory device 100 may be integrated into one semiconductor device. In an embodiment, the controller 1100 and the semiconductor memory device 100 may be integrated into a memory card. For example, the controller 1100 and the semiconductor memory device 100 may be integrated into a memory card such as a PC card (e.g., Personal Computer Memory Card International Association (PCMCIA)), a Compact Flash (CF) card, Smart Media Cards (SM, SMC), a memory stick, multimedia cards (e.g., MMC, RS-MMC, and MMCmicro), SD cards (e.g., SD, miniSD, microSD, and SDHC), and a Universal Flash Storage (UFS).

The controller 1100 and the semiconductor memory device 100 may be integrated into a semiconductor drive (e.g., Solid State Drive (SSD)). The semiconductor drive (e.g., SSD) may include a storage device that stores data in a semiconductor memory.

For another example, the memory system 1000 may be provided as one of various components of an electronic device, such as a computer, an ultra mobile PC (UMPC, a workstation, a net-book computer, personal digital assistants (PDA), a portable computer, a web tablet PC, a wireless phone, a mobile phone, a smart phone, an e-book reader, a portable multimedia player (PMP), a portable game device, a navigation device, a black box, a digital camera, a 3-dimensional television, a digital audio recorder, a digital audio player, a digital picture recorder, a digital picture player, a digital video recorder, a digital video player, a device capable transceiving information in a wireless environment, one of various electronic devices configuring a home network, one of various electronic devices configuring a computer network, one of various electronic devices configuring a telematics network, an RFID device, or one of various components of a computing system.

In an embodiment, the semiconductor memory device 100 or the memory system 1000 may be embedded in various types of packages. Examples of the packages may include Package on Package (PoP), Ball Grid Arrays (BGAs), Chip Scale Packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flat pack (TQFP), Small Outline (SOIC), Shrink Small Outline Package (SSOP), Thin Small Outline (TSOP), Thin Quad Flat pack (TQFP), System In Package (SIP), Multi Chip Package (MCP), Wafer-level Fabricated Package (WFP), and Wafer-Level Processed Stack Package (WSP).

Figure 7:
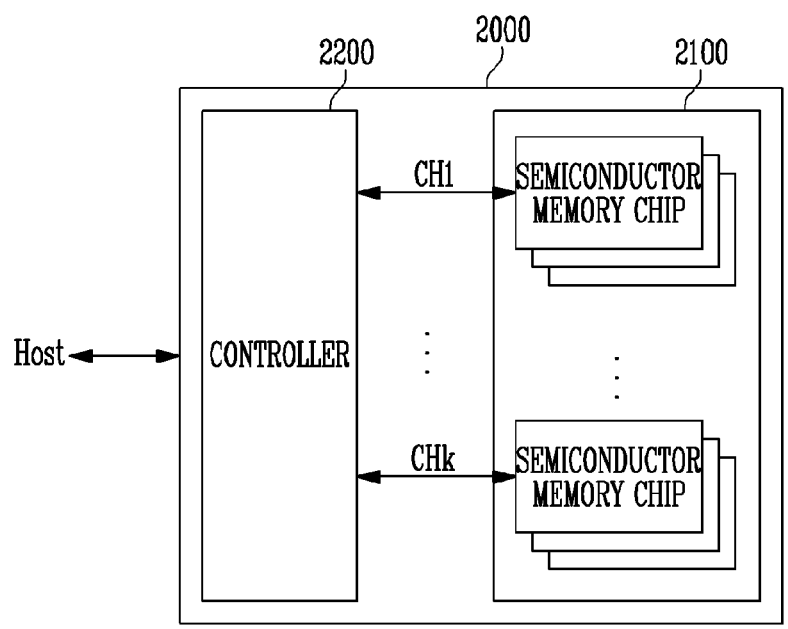
FIG. 7 is a diagram illustrating an application example of the memory system of FIG. 6.

FIG. 7 is a diagram illustrating an application example of the memory system of FIG. 6.

Referring to FIG. 7, a memory system 2000 may include the semiconductor memory device 2100 and a controller 2200. The semiconductor memory device 2100 may include a plurality of semiconductor memory chips. The plurality of semiconductor memory chips may be divided into a plurality of groups.

In FIG. 7, it is illustrated that the plurality of groups communicates with the controller 2200 through first to k$^{th}$ channels CH1 to CHk, respectively. Each semiconductor memory chip may be configured and operated in a similar manner to that of one in the semiconductor memory device 100 described with reference to FIG. 1.

Each group may communicate with the controller 2200 through one common channel. The controller 2200 may be configured in a similar manner to that of the controller 1100 described with reference to FIG. 6, and may control the plurality of memory chips of the semiconductor memory device 2100 through the plurality of channels CH1 to CHk.

Figure 8:
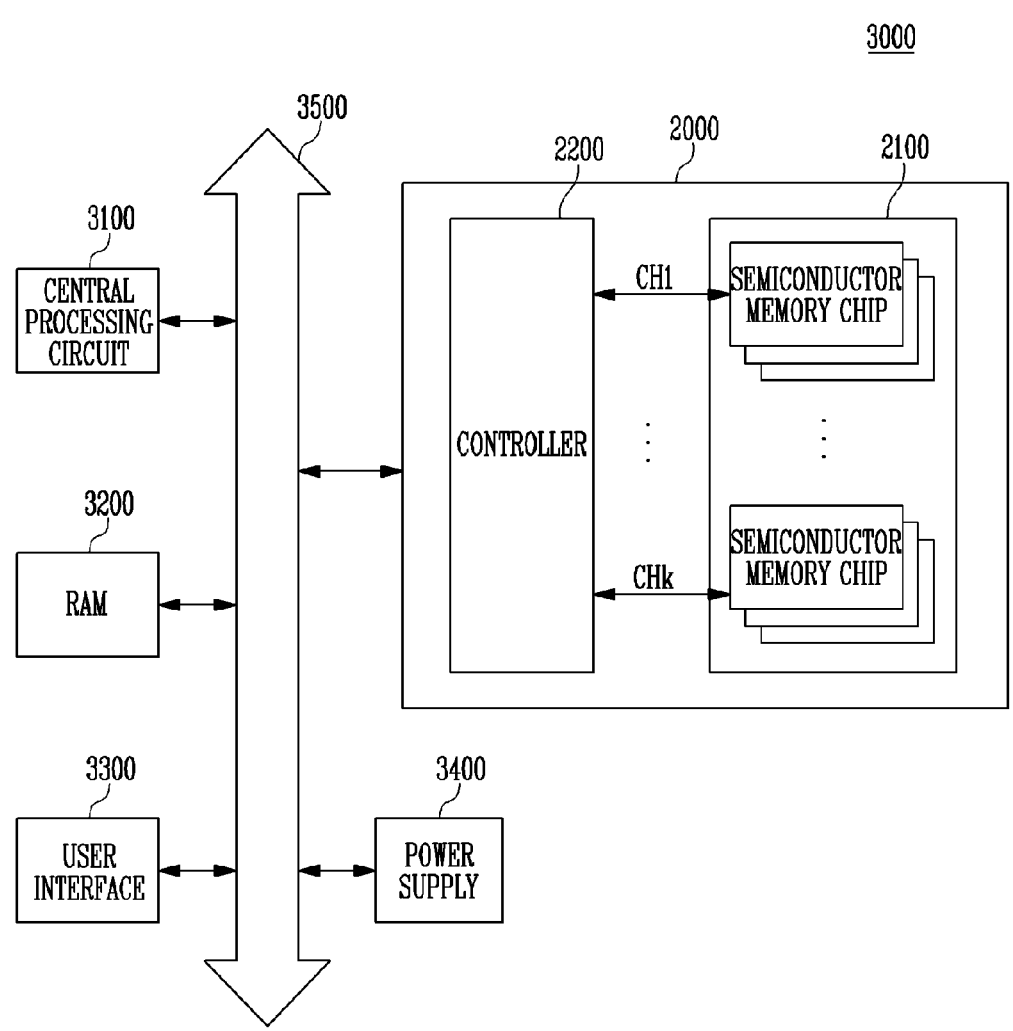
FIG. 8 is a diagram illustrating an example of a computing system including the memory system described with reference to FIG. 7.

FIG. 8 is a diagram illustrating an example of a computing system including the memory system described with reference to FIG. 7.

Referring to FIG. 8, a computing system 3000 may include a central processing circuit 3100, a Random Access Memory (RAM) 3200, a user interface 3300, a power supply 3400, a system bus 3500, and the memory system 2000.

The memory system 2000 may be electrically connected to the central processing circuit 3100, the RAM 3200, the user interface 3300, and the power supply 3400 through a system bus 3500. Data provided through the user interface 3300 or processed by the central processing circuit 3100 may be stored in the memory system 2000.

In FIG. 8, it is illustrated that the semiconductor memory device 2100 is connected to the system bus 3500 through the controller 2200. However, the semiconductor memory device 2100 may be directly connected to the system bus 3500. In this case, a function of the controller 2200 may be performed by the central processing circuit 3100 and the RAM 4200.

In FIG. 8, it is illustrated that the memory system 2000 described with reference to FIG. 7 is provided. However, the memory system 2000 may be substituted with the memory system 1000 described with reference to FIG. 6. In an embodiment, the computing system 3000 may include all of the memory systems 1000 and 2000 described with reference to FIGS. 7 and 6.

The detailed description of the present disclosure includes the description of the particular embodiments, but various modifications are available within the scope without departing from the scope and the technical spirit of the present disclosure. Therefore, the scope of the present disclosure is not limited to the embodiments described, but shall be defined by the claims to be described below and the equivalents to the claims.

What is claimed is:

1. A semiconductor memory device, comprising:
a memory cell array including a first memory string and a second memory string, which have different channel lengths;
a page buffer group configured to perform a sensing operation on the memory cell array in response to a page buffer sensing signal; and
a control logic configured to control the page buffer group to perform the sensing operation, and, during the sensing operation and output the adjusted page buffer sensing signal, adjust a voltage level of the page buffer sensing signal according to a selected memory string.

2. The semiconductor memory device of claim 1, wherein the first memory string includes a first channel having a first pipe channel buried in a pipe gate, and a first source side channel and a first drain side channel, which are connected to both ends of the first pipe channel, and the second memory string includes a second channel having a second pipe channel buried in the pipe gate and is positioned over the first pipe channel, and a second source side channel and a second drain side channel, which are connected to both ends of the second pipe channel.

3. The semiconductor memory device of claim 1, wherein the channel length of the first memory string is larger than the channel length of the second memory string.

4. The semiconductor memory device of claim 1, wherein the memory cell array includes a plurality of memory blocks, and the first memory string and the second memory string belong to different memory blocks to be assigned with different block addresses.

5. The semiconductor memory device of claim 1, wherein the first memory string and the second memory string belong to one memory block, and are connected to different bit lines to be assigned with different column addresses.

6. The semiconductor memory device of claim 1, wherein the control logic includes a sensing signal generating circuit for generating the page buffer sensing signal, and
wherein the sensing signal generating circuit selectively generates a first page buffer sensing signal and a second page buffer sensing signal in response to an address signal, and
wherein an active state of the first page buffer sensing signal has a different voltage level from an active state of the second page buffer sensing signal.

7. The semiconductor memory device of claim 6, wherein the sensing signal generating circuit selectively generates the first page buffer sensing signal and the second page buffer sensing signal in response to a block address or a column address in the address signal.

8. The semiconductor memory device of claim 6, wherein the first page buffer sensing signal in an active state has a higher voltage level than that of the second page buffer sensing signal in an active state.

9. The semiconductor memory device of claim 8, wherein the sensing signal generating circuit generates the first page buffer sensing signal in response to the address signal corresponding to the memory string having the larger channel length between the first memory string and the second memory string.

10. The semiconductor memory device of claim 1, wherein the page buffer group includes a plurality of page buffers coupled to a plurality of bit lines of the memory cell array, and the plurality of page buffers precharges the plurality of bit lines or senses a cell current through the plurality of bit lines in response to the page buffer sensing signal.

11. The semiconductor memory device of claim 10, wherein the plurality of page buffers adjusts an amount of current flowing because of a precharge voltage when precharging the plurality of bit lines or adjusts a current amount of the cell current supplied from the bit line when sensing the cell current according to the voltage level of the page buffer sensing signal.

12. A semiconductor memory device, comprising:
a memory cell array including first memory strings having a first channel length and second memory strings having a second channel length shorter than the first channel length;
a page buffer group configured to perform a sensing operation on the memory cell array in response to a first page buffer sensing signal, which has a first voltage level when enabled, or a second page buffer sensing signal, which has a second voltage level when enabled, the second voltage level being lower than the first voltage level; and
a control logic configured to generate the first page buffer sensing signal or the second page buffer sensing signal in response to an address signal.

13. The semiconductor memory device of claim 12, wherein each of the first memory strings includes a first channel having a first pipe channel buried in a pipe gate, and a first source side channel and a first drain side channel, which are connected to both ends of the first pipe channel, and
each of the second memory strings includes a second channel having a second pipe channel buried in the pipe gate and is positioned over the first pipe channel, and a second source side channel and a second drain side channel, which are connected to both ends of the second pipe channel.

14. The semiconductor memory device of claim 12, wherein the control logic generates the first page buffer sensing signal when the first memory strings are selected during the sensing operation, and generates the second page buffer sensing signal when the second memory strings are selected during the sensing operation.

15. The semiconductor memory device of claim 12, wherein the first memory strings and the second memory strings belong to different memory blocks to be assigned with different block addresses, or belong to the same memory circuit as each other to be assigned with different column addresses.

16. The semiconductor memory device of claim 15, wherein the control logic includes a sensing signal generating circuit, and the sensing signal generating circuit generates the first page buffer sensing signal or the second page buffer sensing signal according to the circuit address or the column address in the address signal.

17. The semiconductor memory device of claim 12, wherein the page buffer group includes a plurality of page buffers coupled to a plurality of bit lines of the memory cell array, and
the plurality of page buffers adjusts an amount of current flowing because of a precharge voltage when precharging the plurality of bit lines or adjusts an amount of the cell current supplied from the bit line when sensing the cell current according to a voltage level of the first page buffer sensing signal or the second page buffer sensing signal.

18. A method of operating a semiconductor memory device, comprising:
providing a memory cell array including a first memory string and a second memory string, which have different channel lengths;
setting a voltage level of a page buffer sensing signal in response to an address signal; and
selecting one of the first memory string and the second memory string in response to the address, and performing a sensing operation according to the page buffer sensing signal set with the voltage level.

19. The method of claim 18, wherein, when the sensing operation is performed by selecting the first memory string having the larger channel length than the second memory string, the voltage level of the page buffer sensing signal is set to be relatively high, and when the sensing operation is performed by selecting the second memory string having the smaller channel length than the first memory string, the voltage level of the page buffer sensing signal is set to be relatively low.

20. The method of claim 18, wherein the voltage level of the page buffer sensing signal is set according to a block address or a column address of the address signal.

* * * * *